(12) United States Patent
Duarte De Martin et al.

(10) Patent No.: US 9,645,196 B2
(45) Date of Patent: *May 9, 2017

(54) TEST STRUCTURE ACTIVATED BY PROBE NEEDLE

(71) Applicant: Freescale Semiconductor, Inc., Austin, TX (US)

(72) Inventors: Fabio Duarte De Martin, Campinas (BR); Andre Luis Vilas Boas, Campinas (BR)

(73) Assignee: NXP USA, INC., Austin, TX (US)

( * ) Notice: Subject to any disclaimer, the term of this patent is extended or adjusted under 35 U.S.C. 154(b) by 1063 days.

This patent is subject to a terminal disclaimer.

(21) Appl. No.: 13/684,840

(22) Filed: Nov. 26, 2012

(65) Prior Publication Data

US 2013/0082726 A1  Apr. 4, 2013

Related U.S. Application Data

(62) Division of application No. 12/749,621, filed on Mar. 30, 2010, now Pat. No. 8,339,152.

(51) Int. Cl.
*G01R 31/26* (2014.01)
*G01R 31/28* (2006.01)

(52) U.S. Cl.
CPC ..... *G01R 31/2884* (2013.01); *G01R 31/2896* (2013.01)

(58) Field of Classification Search
CPC . G01R 31/26; G01R 31/2884; G01R 31/3187
See application file for complete search history.

(56) References Cited

U.S. PATENT DOCUMENTS

| 5,687,178 | A | | 11/1997 | Herr et al. |
| 5,712,576 | A | * | 1/1998 | Nagataki ............ G01R 31/2844 324/762.02 |
| 5,870,408 | A | * | 2/1999 | Aggarwal et al. ............ 714/724 |
| 5,896,040 | A | * | 4/1999 | Brannigan et al. ........ 324/750.3 |
| 7,061,263 | B1 | | 6/2006 | Ong |
| 7,248,067 | B2 | | 7/2007 | Poechmueller |
| 8,339,152 | B2 | * | 12/2012 | Duarte De Martin ............... G01R 31/2884 324/750.3 |
| 2007/0080739 | A1 | | 4/2007 | Taki et al. |
| 2010/0327893 | A1 | | 12/2010 | Vilas Boas et al. |

* cited by examiner

*Primary Examiner* — Minh N Tang

(57) ABSTRACT

A test structure (200) in an integrated circuit (100) includes a probe pad (210) disposed at a surface of a die (102) of the integrated circuit, a transmission gate (202) for connecting portions of an electronic circuit within the integrated circuit in response to a momentary signal applied to the probe pad, a first inverter (221) having an input coupled to the probe pad and having an output coupled to a control input of the transmission gate, and a second inverter (222) having an input coupled to an output of the first inverter and having an output coupled to another control input of the transmission gate. The output of the second inverter is coupled to the input of the first inverter. Upon power-up, the transmission gate is open. After the momentary signal is applied to the probe pad, the transmission gate closes and remains closed until power is disconnected.

20 Claims, 6 Drawing Sheets

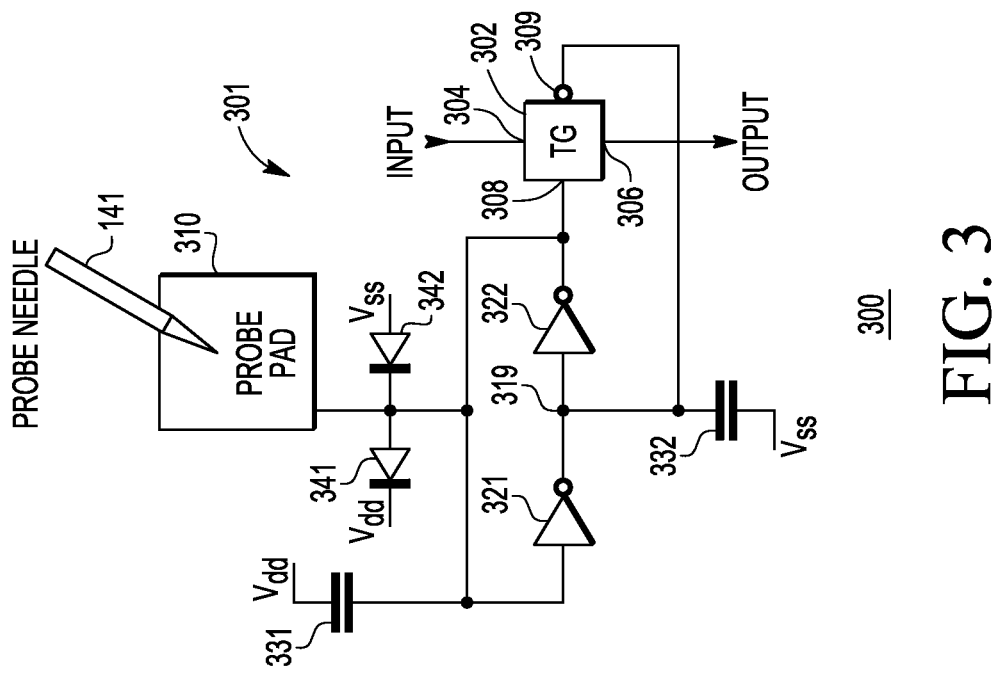
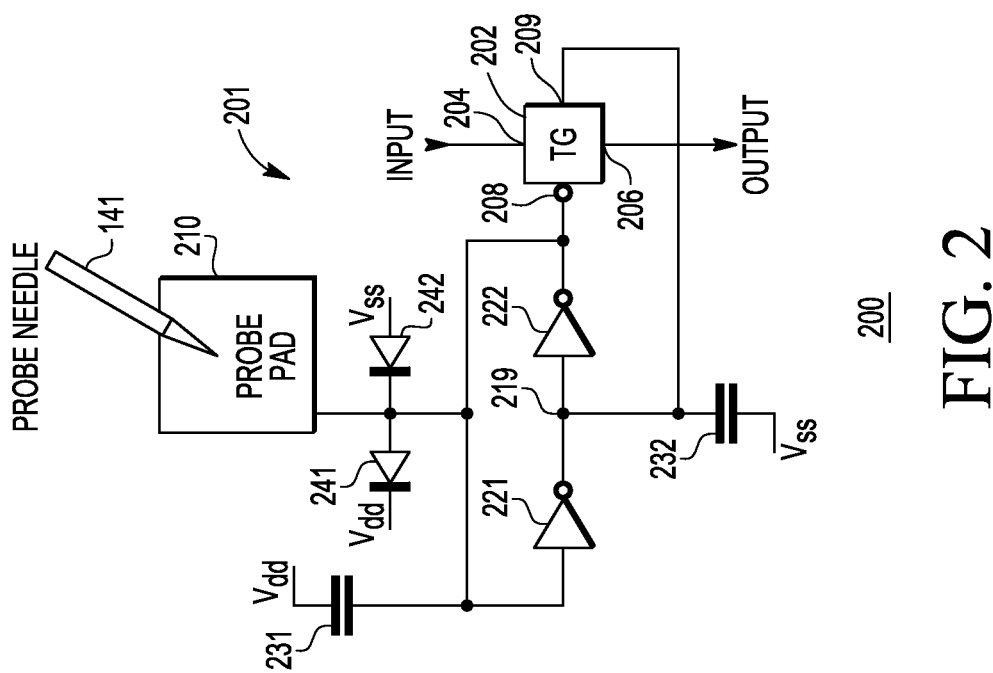
FIG. 3
FIG. 2

TEST STRUCTURE ACTIVATED BY PROBE NEEDLE

CROSS REFERENCE TO RELATED APPLICATIONS

This is a divisional of application Ser. No. 12/749,621, filed Mar. 30, 2010, now U.S. Pat. No. 8,339,152. The entire disclosure of prior application Ser. No. 12/749,621 is hereby incorporated by reference.

BACKGROUND

Field

This invention relates generally to testing integrated circuits and more specifically to a circuit and structure at a test point of an integrated circuit for use during testing of the integrated circuit after packaging of the integrated circuit.

Related Art

An integrated circuit comprises a die that is typically packaged, or encapsulated, for example, in opaque ceramic, plastic insulation or resin. For a normally encapsulated die, the only coupling of signals between the die and the outside world is with metal pins through the insulation. Therefore, for a normally encapsulated die, a signal that only exists within the packaging and does not appear at one of the pins cannot be readily accessed unless there is an opening in the packaging.

An integrated circuit that is normally packaged using another material may be manufactured using ceramic packaging with an opening in the packaging over the die in order that the die can be accessed so that tests of the integrated circuit can be performed. The functionality of an integrated circuit usually does not change with the type of packaging; therefore, integrated circuits that are normally encapsulated, for example, in plastic can be accurately tested when encapsulated in ceramic. The testing of integrated circuits that are packaged in such a way is called "after package", or final, testing, as opposed to other testing, such as chip probing that occurs before packaging, i.e., when the integrated circuit is still in a wafer stage of manufacture.

The behavior of some analog circuits in integrated circuits is affected by technology process variations that occur during fabrication. Oscillator and bandgap voltage generator circuits are particularly affected by technology process variations; therefore, internal signals related to these circuits are tested to debug the functionality of these circuits, and some trimming of these circuits is usually necessary.

Most analog circuits within integrated circuits include test structures such as probe pads and metal tweak points for laboratory evaluations. Occasionally, adjustments are necessary on packaged samples of integrated circuits because the packaging procedure itself can alter the results of testing that may have been done at the wafer stage. Some integrated circuits include trimming structures, such as fuses, to allow such adjustments or for laboratory evaluation. An ideal trimming exercise should evaluate each on/off effect of trimming by actually connecting or disconnecting portions of a circuit of the packaged sample. One way to conduct such an exercise is to make cuts with a laser and/or to add metal to implement jumpers, such as by using a focused ion beam (FIB) station that can accurately cut tracks and/or deposit tungsten jumpers and so emulate actual trimming action. However, changes made with a FIB station cannot easily be reversed.

With some known final testing methods, a probe needle must remain in contact with a probe pad on the die of the integrated circuit; therefore, the window of the packaging must disadvantageously remain open during testing. Testing over temperature may be difficult if the packaging is open for any reason, such as the cover to the window of the packaging not being in place because a probe needle must remain in contact with a pad probe on the die of the integrated circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 2 is a schematic of one embodiment of a test structure located in the integrated circuit of FIG. 1.

FIG. 3 is a schematic of another embodiment of a test structure located in the integrated circuit of FIG. 1.

DETAILED DESCRIPTION

Figure 1:
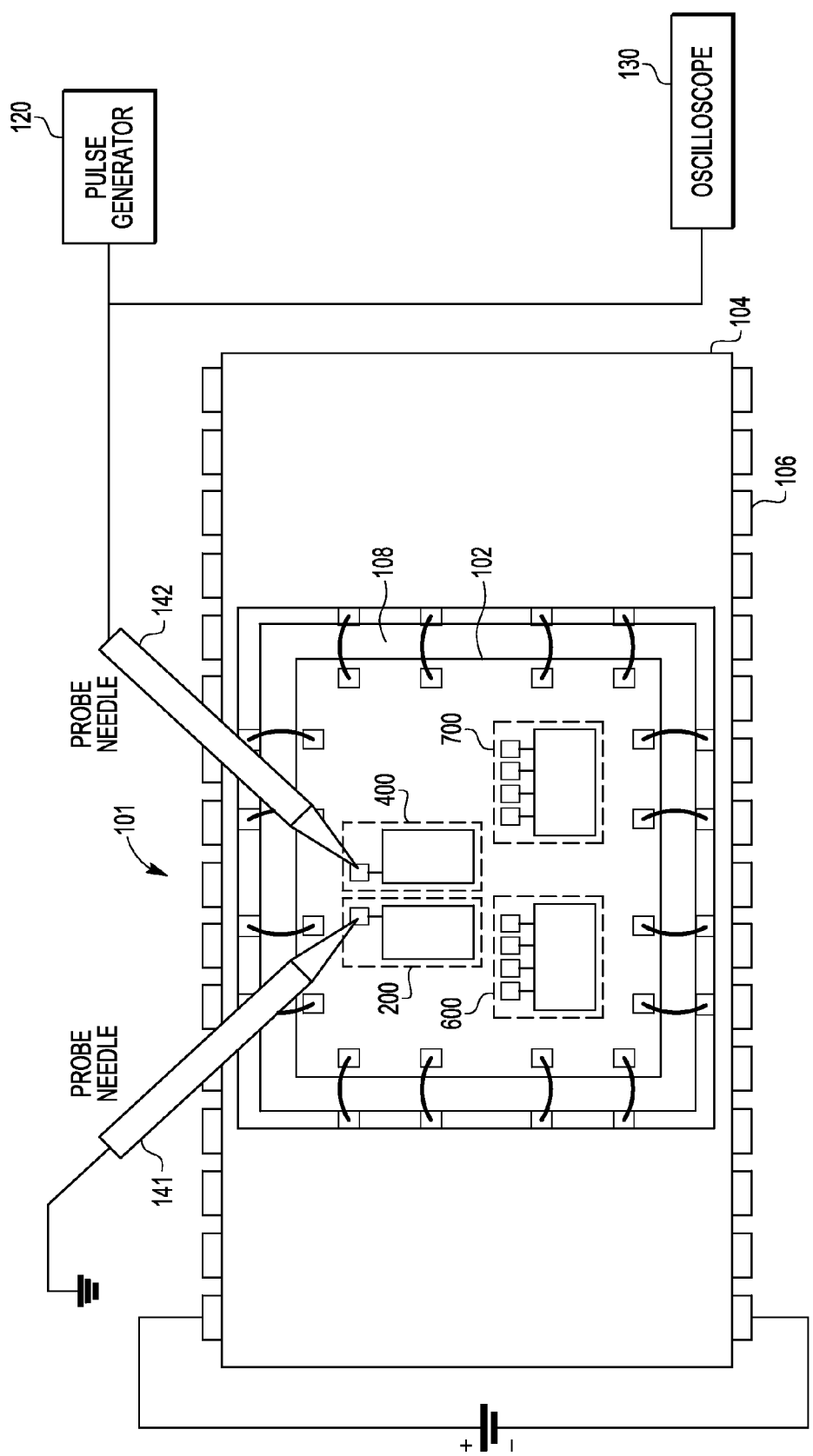
FIG. 1 illustrates an integrated circuit and a simplified functional block diagram of a system for the testing the integrated circuit in accordance with the invention.

FIG. 1 is a simplified functional block diagram of a system 100 in accordance with the invention for testing an integrated circuit 101. In one embodiment, the integrated circuit 101 is a System on Chip (SoC). The integrated circuit 101 includes a die 102 on which a plurality of microelectronic circuits is disposed, surrounded by a package 104. The integrated circuit 101 includes a plurality of pins 106 that couples the plurality of microelectronic circuits on the die 102 to other circuits outside the package 104. Typically, a test version of the integrated circuit 101 is encapsulated with a ceramic package 104 that has an opening 108 over the die 102 so that the die can be accessed during final testing. The test version of the integrated circuit 101 typically includes a metal window (not shown) that can be removed for accessing the die 102 and that can be replaced over the opening 108 when the die is not being accessed. Typically, the cover is replaced over the opening 108 subsequent to trimming but prior to temperature testing of the integrated circuit 101.

The system 100 may include an apparatus (not shown) that holds the integrated circuit 101 that is being tested and repositions the integrated circuit at an appropriate location. The system 100 includes a pulse generator 120 for generating a pulse, and an oscilloscope 130 for detecting, measuring and viewing a signal. The system 100 may use a microprobe machine (not shown) that includes a probe needle. A purpose of the probe needle is to make electrical (physical) contact with a test point of the integrated circuit 101. In one embodiment, the probe needle 141 is coupled to ground, or $V_{SS}$. In another embodiment, the probe needle 142 is coupled to both the pulse generator 120 and to the oscilloscope 130. The pulse generator can be test equipment that is external to the integrated circuit 101, as shown in FIG. 1, or the pulse generator 120 can be a microelectronic circuit within the integrated circuit. The pulse generator 120 generates one or more pulses. The pulse generator 120 allows control of the repetition rate (i.e., frequency), width, delay with respect to an internal or external trigger, and high-voltage and low-voltage levels of the pulses.

The integrated circuit 101 includes at least one test structure 200. The at least one test structure 200 is disposed on a circuit-supporting substrate, such as the die 102 of the integrated circuit 101. Typically, the at least one test structure 200 is located near a test point of the integrated circuit 101. The at least one test structure 200 is coupled to one or more other microelectronic circuits (not shown) on the die 102 of the integrated circuit 101. The at least one test structure 200 includes a switch activated by the probe needle 141. By "activated" it is meant that the test structure swaps its natural state, that is, the test structure changes its state from open to closed, or vice versa. By "natural" state, it is meant the state that the test structure enters after being powered-up. Once the switch is activated, the probe needle 141 can be removed (but does not need to be removed), and the at least one test structure 200 advantageously retains the new configuration until power to the integrated circuit 101, and, therefore, power to the test structure, is disconnected. As a result, a robust evaluation can be done under various conditions, for example, under different conditions of temperature, voltage, and mechanical stress.

FIG. 2 is a schematic of the test structure 200 in accordance with one embodiment of the invention. The test structure 200 comprises a switching circuit 201 in which the switch comprises a transmission gate that is activated by the probe needle 141. The switching circuit 201 comprises a CMOS transmission gate 202 that comprises a parallel combination of a PMOS transistor and an NMOS transistor. The CMOS transmission gate 202 has an input 204 and an output 206. The CMOS transmission gate 202 has a first control input 208 coupled to a gate of the PMOS transistor and a second control input 209 coupled to a gate of the NMOS transistor. The CMOS transmission gate 202 selectively blocks or passes a signal from the input 204 to the output 206 depending on the signals at the control inputs 208 and 209. The control inputs 208 and 209 of the CMOS transmission gate 202 are biased in a complementary manner so that both the PMOS transistor and the NMOS transistor are either on or off. When there is a value of logical "1" at the first control input 208 and a complementary value of logical "0" at the second control input 209, both transistors of the CMOS transmission gate 202 are turned off, and any signal that may be present at the input of the transmission gate does not pass to the output of the transmission gate. However, when there is a value of logical "0" at the first control input 208 and a complementary value of logical "1" at the second control input 209, both transistors of the CMOS transmission gate 202 are turned on and the transmission gate 202 passes any signal that may be present at the input of the transmission gate to the output of the transmission gate, without degradation. The test structure 200 has a normally-open state, which means that, upon power-up, the CMOS transmission gate 202 of the switching circuit 201 is open. When the test structure 200 is in an open state, both transistors of the CMOS transmission gate 202 are off, and, as a result, a high impedance exists between the input of the transmission gate and the output of the transmission gate. In one embodiment, the input 204 and the output 208 of the transmission gate 202 are coupled to a circuit (not shown) that may need trimming, and the test structure 200 is used to trim a value of a parameter of such circuit that may need trimming.

The switching circuit 201 includes a first inverter 221 and a second inverter 222. An output of the first inverter 221 is coupled to an input of the second inverter 222. An output of the second inverter 222 is coupled to the first control input 208 of the transmission gate 202. In one embodiment, each inverter 221 and 222 of the switching circuit 201 comprises a PMOS transistor (not shown) and an NMOS transistor (not shown). The inverters 221 and 222 are used to maintain the state of the switching circuit 201 in a manner described herein below.

The switching circuit 201 includes a first start-up capacitor 231 with one end coupled to $V_{DD}$ and another end coupled to an input of the first inverter 221 and to the first control input 208 of the transmission gate 202. In one embodiment, $V_{DD}$ is 3V. Typically, $V_{DD}$ is a voltage between 1.2V and 5.0V. The switching circuit 201 includes a second start-up capacitor 232 with one end coupled to $V_{SS}$ and another end coupled to the second control input 209 of the transmission gate 202 and to a node 219 between the first inverter 221 and the second inverter 222. In one embodiment, $V_{SS}$ is at ground potential, or 0V. The start-up capacitors 231 and 232 are primarily responsible for ensuring that the inverters 221 and 222 start in a proper state. The first start-up capacitor 231 ensures that $V_{DD}$, or logical "1", is present at the input to the first inverter 221 at power-up, and the second start-up capacitor 232 ensures that $V_{SS}$, or logical "0", is present at the input of the second inverter 222 at power-up. The probe pad 210 is floating until the probe needle 141 touches it; therefore, the probe pad does not affect the state of the inverters 221 and 222 or the state of the transmission gate 202, at power-up. After power-up, the start-up capacitors 231 and 232 do not affect the voltages at the inputs of the inverters 221 and 222.

In one embodiment of the first inverter 221, the ratio of channel width to channel length (W/L) of its NMOS transistor is made larger than the W/L of its PMOS transistor, so that the first inverter is more ensured to start with a low, or logical "0", output. In one embodiment of the second inverter 222, the W/L of its NMOS transistor is made smaller than the W/L of its PMOS transistor, so that the second inverter is more ensured to start with a high, or logical "1", output.

The test structure 200 includes a probe pad 210, which is a flat metallic member disposed near the surface of the die 102 above which a portion of a passivation layer of the die has been removed so that the probe needle 141 can make direct contact with the probe pad 210. In one embodiment, the probe pad 210 has a size of approximately 10 µm by 10 µm. A via (not shown) couples the probe pad 210 to other components of the test structure 200. The probe pad 210 is coupled to the input of the first inverter 221 and to the first control input 208 of the transmission gate 202.

Optionally, the test structure 200 includes a first electrostatic discharge (ESD) diode 241 coupled between $V_{DD}$ and the probe pad and a second ESD diode 242 coupled between $V_{SS}$ and the probe pad. The first and second ESD diodes 241 and 242 protect the switching circuit 201 from electrostatic discharge that may occur, such as when the integrated circuit 101 is improperly handled.

The normally-open test structure 200 can emulate a jumper action when the test structure is activated. After power-up of the switching circuit 201, a logical "1" is present at the input of the first inverter 221, a logical "0" is present at node 219, and a logical "1" is present at the first control input 208 of the transmission gate 202. For as long as power is supplied to the switching circuit 201, the inverters 221 and 222 maintain a logical "1" at the first control input 208 of the transmission gate 202, and inverter 221 maintains a logic "0" at the second control input 209 of the transmission gate 202, and the transmission gate remains open. The normally-open switching circuit 201 is activated by applying a logical "0" to the switching circuit 201 through the probe pad 210. This is accomplished by touching the probe needle 141, which is grounded, to the probe pad 210. This causes a logical "0" to be present at the input of the first inverter 221, a logical "1" to be present at node 219, and a logical "0" to be present at the first control input 208 of the transmission gate 202. As a result, the transmission gate 202 closes, thereby shorting the input 204 of the transmission gate to the output 206 of the transmission gate. Advantageously, the switching circuit 201 keeps the new state (closed state) after the probe needle 141 is removed from contact with the probe pad 210. This is because the inverters 221 and 222 maintain a logical "0" at the first control input 208 of the transmission gate 202 and a logical "1" at the second control input 209 of the transmission gate, for as long as power is supplied to the switching circuit 201. The switching circuit 201 returns to its natural state (open state) after power is disconnected from the switching circuit. Alternatively, if power supply remains connected to the switching circuit 201, the switching circuit 201 is returned to its natural state applying a $V_{DD}$ pulse to the probe pad 210.

FIG. 3 is a schematic of a normally-closed test structure 300, including a normally-closed switching circuit 301. The structure and function of the normally-closed switching circuit 301 are similar to the structure and function of the normally-open switching circuit 201; therefore, the normally-closed switching circuit 301 will not be described in detail, except for how it differs from the normally-open switching circuit. In the normally-closed switching circuit 301, upon power-up, both transistors of the transmission gate 302 are on, and, as a result, any signal (e.g., logical "0" or logical "1") that may be present at the input 304 of the transmission gate 302 is passed to the output 306 of the transmission gate. The normally-closed test structure 300 can emulate a cut action when the normally-closed test structure is activated. The normally-closed test structure 300 is activated by applying a "0" to the normally-closed switching circuit 301 through the probe pad 310, and, as a result, the transmission gate 302 opens, thereby breaking the path between the input 304 of the transmission gate and the output 306 of the transmission gate. Advantageously, the normally-closed test structure 300 keeps the new state (open state) after the probe needle 141 is removed from contact with the probe pad 310. The normally-closed test structure 300 can be returned to its natural state (closed state) by disconnecting normally-closed switching circuit 301 from the power supply. If the power supply remains connected to the normally-closed switching circuit 301, the normally-closed test structure 300 can be returned to its natural state by applying a $V_{DD}$ pulse to the probe pad 310.

Each test structure 200 and 300 includes a switch and is activated by application of a low-level (ground) pulse to the probe pad. For both embodiments (see FIGS. 2 and 3) of the test structure, upon contact of the probe needle 141, which is at ground potential ($V_{SS}$), with the probe pad 210 and 310, the test structure changes state. Advantageously, the contact of the probe needle 141 with the probe pad 210 and 310 needs only be momentary for the test structure to change state. Advantageously, the test structure 200 and 300 retains the new state, which is different from its natural state, for as long as power is supplied to the test structure.

Figure 4:
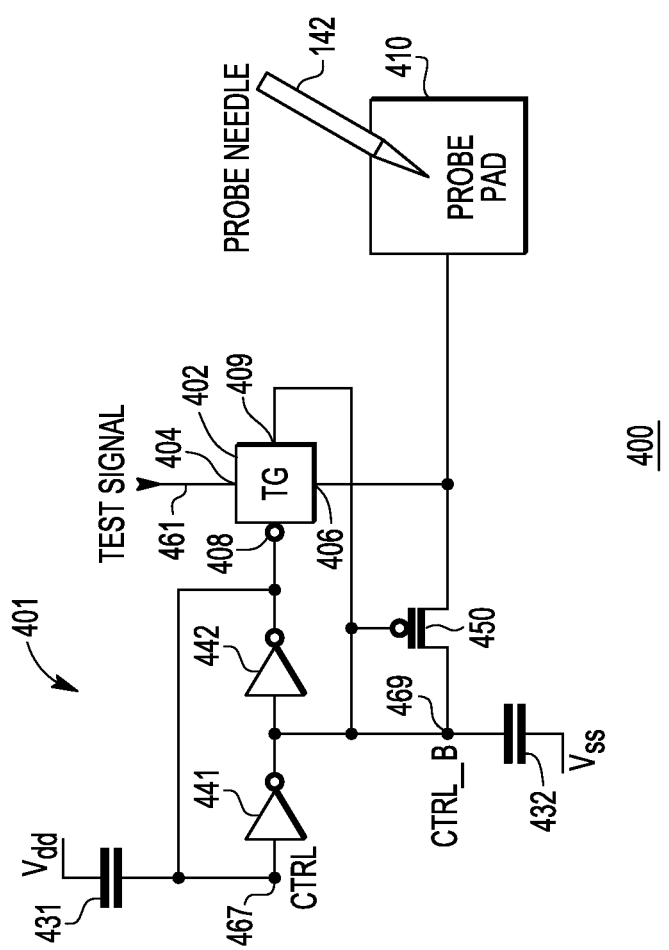
FIG. 4 is a schematic of a measure structure, located in the integrated circuit of FIG. 1, used to measure a test signal or other parameter in the integrated circuit.

FIG. 4 is a schematic of a measure structure 400, located in the integrated circuit 101, used to measure a test signal 461 from a test signal producing circuit (not shown) also located in the integrated circuit. The test signal 461 is a signal being measured or viewed, and may be any type of signal or other parameter, such as an analog waveform or a digital pulse, from another circuit of the integrated circuit 101. Typically, the test signal is an internal-only signal, i.e., a signal that exists only within the integrated circuit 101 and that is not accessible at any pin 106.

The measure structure 400 comprises a measure circuit 401 that includes a normally-open transmission gate 402, whose structure is similar to transmission gate 202. The measure circuit 401 includes a PMOS transistor 450 having a gate coupled to a node between a first inverter 441 and a second inverter 442, and to a second control input of the transmission gate 402. The PMOS transistor 450 has a drain coupled to its gate. The measure structure 400 includes a probe pad 410 coupled to the measure circuit 401. The probe pad 410 is coupled to an output 406 of a transmission gate 402 and to a source of the PMOS transistor 450.

In order to test the integrated circuit 101, a high level ($V_{DD}$) pulse is applied to the probe pad 410 to activate the measure circuit 401. The probe needle 142 is used to apply the high level ($V_{DD}$) pulse to the probe pad 410, which changes the state of the transmission gate 402 to a closed state, thereby activating the measure circuit 401. The duration of the pulse must be long enough for the PMOS transistor 450 to turn on. If the probe needle 142 is coupled to ground, the state of the transmission gate 402 does not change and the measure circuit 401 does not become activated. Subsequent to activating the measure circuit 401, the same probe needle 142 becomes part of a path used to read or to inject a test signal 461.

Once the high level ($V_{DD}$) pulse is applied, an internal test signal (i.e., internal to the integrated circuit 101) that is being tested can be measured using the oscilloscope 130 using the same probe needle 142. In one embodiment, the pulse generator 120 is disconnected from the probe needle 142 after the measure circuit 401 is activated to avoid any interference between the pulse and the internal signal being tested. In another embodiment, the pulse generator 120 remains connected to the probe needle 142 but generates only one pulse to avoid any interference between the pulse and the internal signal being tested. The measure circuit 401 can be configured to read or drive an internal signal using the same probe needle 142.

Advantageously, the test structure 400 remains activated (i.e., the transmission gate 402 retains its closed state) after the probe needle 142 is removed from contact with the probe pad 410. The only way to return the measure structure 400 to its natural state is to turn off the power supply to the measure circuit 401.

A method of using the measure structure 400 includes the following steps. Upon power-up of the measure circuit 401, the probe needle 142 is not connected to the probe pad 410. The transmission gate 402 starts in its natural state at power-up. In the embodiment of the measure circuit 401 shown in FIG. 4, the natural state of the transmission gate 402 is a normally-open state.

Figure 5:
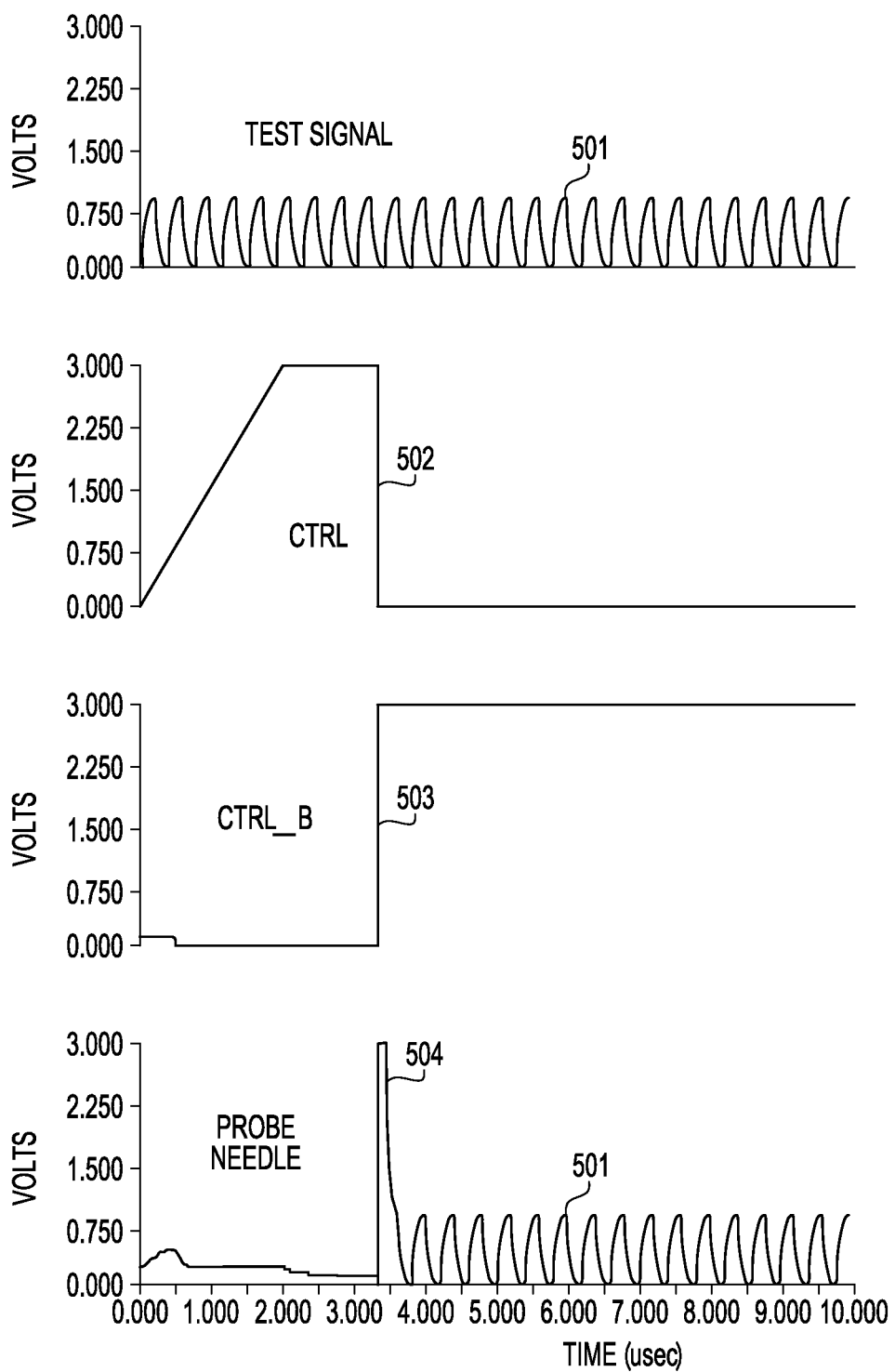
FIG. 5 illustrates graphs of signals present in the structure shown in FIG. 4 and in a probe needle.

After power-up of the measure circuit 401, the voltage at a CTRL node 467 rises to $V_{DD}$, or logical "1". After power-up of the measure circuit 401, the voltage at a CTRL_B node 469 and the voltage at the drain and at the gate of the PMOS transistor 450 goes to $V_{SS}$, or logical "0". After power-up of the measure circuit 401 (but before the probe needle 142 touches the probe pad 410), the voltage at the source of the PMOS transistor 450 is floating and undefined because the transmission gate 402 is open and because the probe pad 410 is isolated. FIG. 5 shows that, during the first approximately 3.5 µs after $V_{DD}$ is applied to the measure circuit 401, the voltage at the probe pad 410 is an irregular voltage of approximately 0.5V due to parasitic voltages that appear on the floating probe pad.

For the purpose of fully understanding the measure circuit 401, it should be noted that if a probe needle that is grounded (such as probe needle 141) were placed in contact with the probe pad 410, the voltage at the source of the PMOS transistor 450 would then be defined and would be 0V. The voltage at the drain of the PMOS transistor 450 would remain at 0V. The voltage at the gate of the PMOS transistor 450 would remain at 0V. The PMOS transistor 450 would remain non-conducting. In such case, instead of an irregular voltage of approximately 0.5V appearing on the probe pad 410 (see FIG. 5), the voltage on the probe pad during the first approximately 3.5 µs after $V_{DD}$ is applied would be 0V. In such case, the measure circuit 401 would keep its initial condition, and the transmission gate 402 would remain open.

Next, after power-up, the probe needle 142 is coupled to $V_{DD}$ and is placed in contact with the probe pad 410 to activate the measure circuit 401. As a result, the voltage at a source of the PMOS transistor 450 is $V_{DD}$, which causes the PMOS transistor to start conducting, i.e., the PMOS transistor turns on, and the drain of the PMOS transistor, and, therefore, the voltage at the CTRL_B node 469, goes to $V_{DD}$. Because the voltage at the CTRL_B node 469 goes to $V_{DD}$, the voltage at the gate of the PMOS transistor 450 also goes to $V_{DD}$, and the PMOS transistor turns off and stops conducting. Because the voltage at the CTRL_B node 469 goes to $V_{DD}$, or logical "1", the control inputs of the transmission gate 402 change. Specifically, the first control input 408 of the transmission gate 402 changes from logical "1" to logical "0", and the second control input 409 changes from logical "0" to logical "1"; as a result, the state of the transmission gate changes from being open to being closed. Consequently, the measure circuit 401 is activated, and the test signal 461, which is coupled to the input 404 of the transmission gate 402, is transmitted to the output 406 of the transmission gate and to the probe pad 410.

Upon activation of the measure circuit 401, the PMOS transistor 450 turns off, and, as a result, the PMOS transistor isolates the inverters 441 and 442 from any signal that may be on the probe pad 410 and/or the probe needle 142. After the probe needle 142 injects the pulse into the measure structure 400, the same probe needle can subsequently measure internal signals by measuring voltage levels at the probe pad 410. If the system 100 detects a signal, such as the test signal 461, at the probe pad 410, the system quickly goes to a high-Z, i.e., high input impedance, state. The system goes to the high-Z state because the PMOS transistor 450 is not conducting.

Another embodiment of the measure structure 400 includes first and second ESD diodes (not shown), coupled to the probe pad 410 in a manner similar to the way first and second ESD diodes 241 and 242 of FIG. 2 are coupled to test structure 200, to protect the CMOS transistors of the measure structure 400.

FIG. 5 illustrates graphs of signals present in the measure structure 400. FIG. 5 shows a graph 501 of the test signal 461. In the measure structure 400, the test signal 461 is coupled to the input 404 of the transmission gate 402. FIG. 5 shows a graph 502 of the signal at the CTRL node 467 of the measure structure 400. After power-up of the measure structure 400, the voltage at the CTRL node 467 rises to about 3V after about 2 µs. FIG. 5 shows a graph 503 of the signal at the CTRL_B node 469 of the measure structure 400. After power-up of the measure structure 400, the voltage at the CTRL_B node 469 remains at substantially 0V until about 3.5 µs after power-up. FIG. 5 shows a graph of signals at the probe needle 142. At about 3.5 µs after power-up of the measure structure 400, a single pulse 504 of magnitude of about 3V and duration of several nanoseconds is applied to the probe needle 142 and to the probe pad 410 (assuming the probe needle is in contact with the probe pad). After the single pulse 504, the test signal 501 appears on the probe pad 410 and on the probe needle 142 (assuming the probe needle is in contact with the probe pad).

Figure 6:
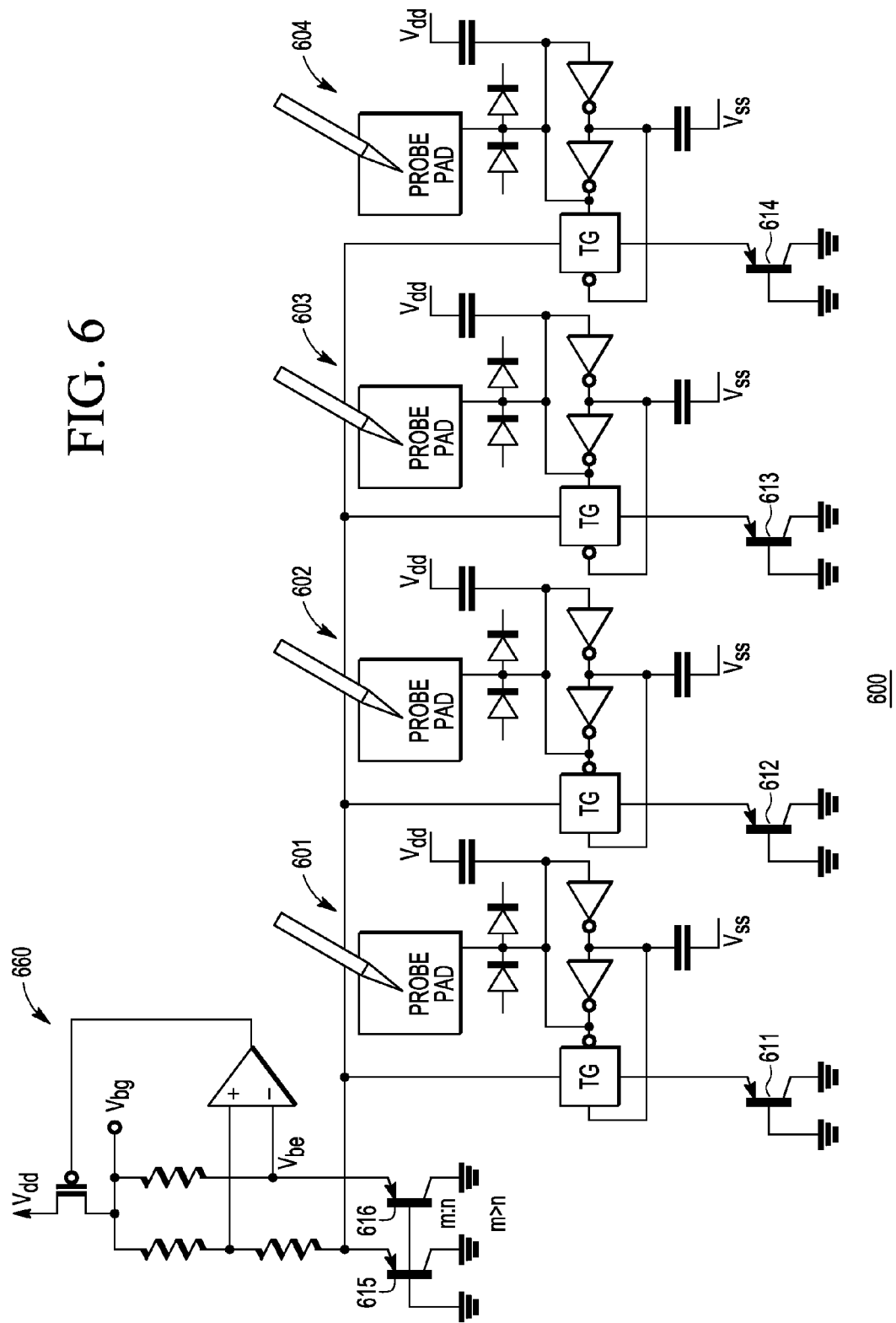
FIG. 6 illustrates a circuit, located in the integrated circuit of FIG. 1, including a bandgap voltage generator circuit and a plurality of test structures used to trim a voltage of the bandgap voltage generator circuit.

FIG. 6 illustrates a circuit 600, including a bandgap voltage generator circuit 660 located in the integrated circuit 101 and a plurality of test structures 601, 602, 603 and 604 also located in the integrated circuit, used to trim a bandgap voltage of the bandgap voltage generator circuit. Test structures 601 and 602 are similar to test structure 200. Test structures 603 and 604 are similar to test structure 300. The operation of the bandgap voltage generator circuit 660 is well known; therefore, only a description of the portion of the bandgap voltage generator circuit that interacts with the test structures 601, 602, 603 and 604 is given herein below. The bandgap voltage generator circuit 660 includes a PNP bipolar transistor 615 that has an effective size "m", and a PNP bipolar transistor 616 that has an effective size "n". The curvature of a graph of the bandgap voltage $V_{bg}$ with respect to temperature depends on the ratio m:n. The activation of one or more test structures 601, 602, 603 and 604 changes the bandgap voltage by adding or removing one or more trimming PNP transistors 611, 612, 613 and 614 to or from a parallel configuration with PNP transistor 615, thereby changing the ratio m:n.

In another embodiment, one of the test structures 601, 602, 603 and 604 shown in FIG. 6 is replaced by the measure structure 400. For example, if normally-open test structure 603 is replaced by the normally-open measure structure 400, a same probe pad 410 could be used for changing the state of the transmission gate 402 (thereby adding trimming PNP bipolar transistor 613 to a parallel configuration with PNP bipolar transistor 615) and for measuring a signal at the emitter of the PNP bipolar transistor 615 after the transmission gate is closed. In this embodiment, the signal at the emitter of the PNP bipolar transistor 615 appears at the probe pad 410 and can be read by the probe needle 142.

Figure 7:
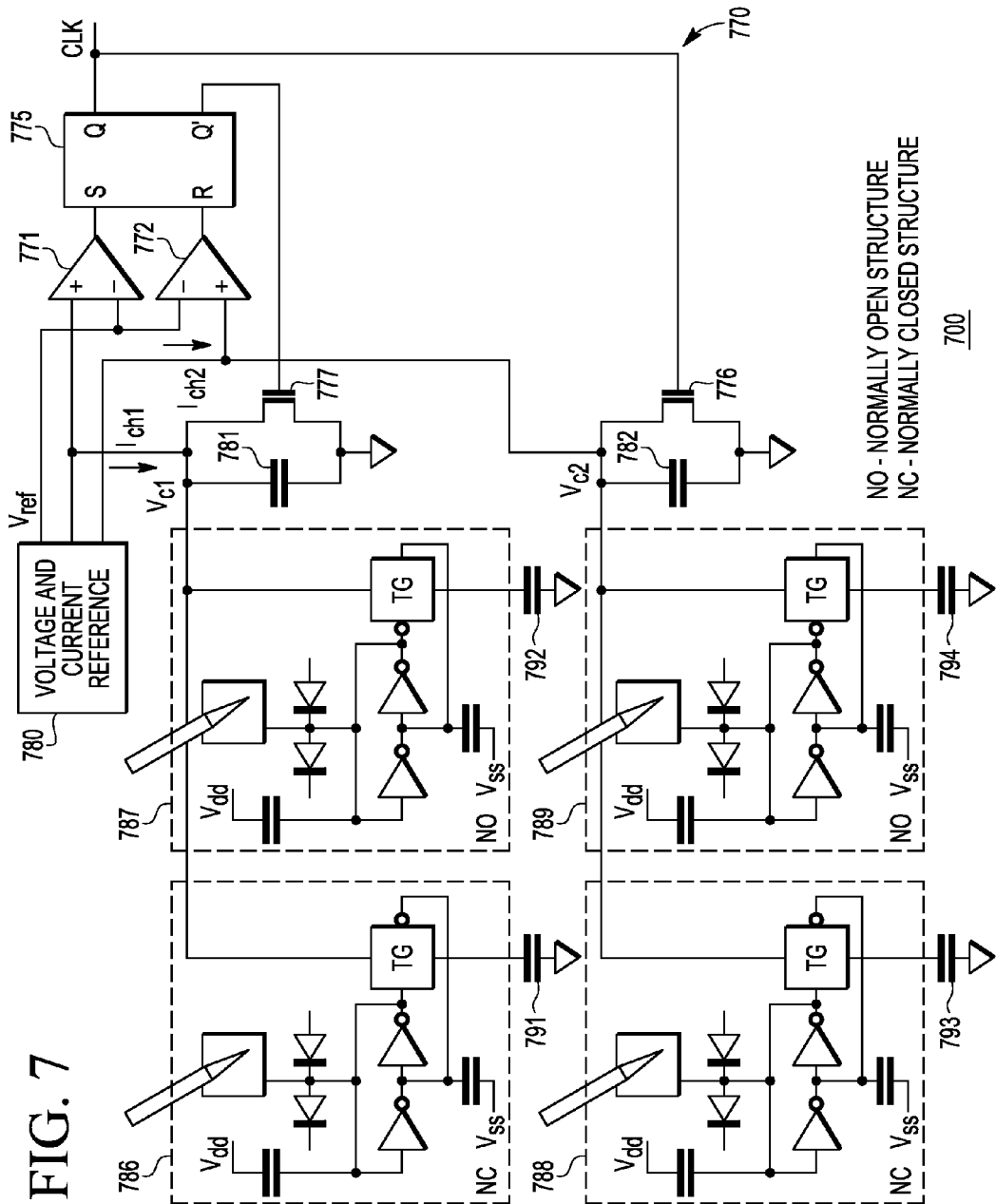
FIG. 7 illustrates a tuning circuit, located in the integrated circuit of FIG. 1, including an oscillator circuit and a plurality of test structures used to tune a frequency of the oscillator circuit.

FIG. 7 illustrates a tuning circuit 700 for tuning an oscillator circuit. The tuning circuit 700 is a microelectronic circuit within the integrated circuit 101. The tuning circuit 700 comprises an oscillator circuit 770 and a plurality of test structures used to trim, or tune, a frequency of the oscillator circuit. The operation of the oscillator circuit 770 is well known; therefore, a description of only the portion of the oscillator circuit that interacts with the plurality of test structures is given herein below. The oscillator circuit 770 includes a voltage and current reference circuit 780 that has outputs $V_{ref}$, $I_{ch1}$ and $I_{ch2}$ that are coupled to analog comparators 771 and 772. The outputs of the analog comparators 771 and 772 are coupled to a SR flip-flop 775. Outputs Q and Q' from the flip-flop 775 go to a gate of an NMOS transistor 776 and 777, respectively, which acts as a switch that shorts the capacitor 782 and 781, respectively, at the clock rate. The oscillator circuit 770 is a symmetrical circuit that has a first half through which $I_{ch1}$ flows and a second half through which $I_{ch2}$ flows. The tuning circuit 700 includes a plurality of test structures 786 and 787 in the first half of the circuit and a plurality of test structures 788 and 789 in the second half of the circuit. Test structures 786 and 788 are similar to test structure 300. Test structures 787 and 789 are similar to test structure 200. The tuning circuit 700 includes a tuning capacitor 791, 792, 793 and 794 coupled to each one of the test structures 786, 787, 788 and 789, respectively. Each test structure 786, 787, 788 and 789 selectively couples a tuning capacitor 791, 792, 793 and 794 into a parallel configuration with capacitor 781 or 782.

The frequency of the oscillator circuit 770 is a function of reference voltage $V_{ref}$, charge current $I_{ch}$, and capacitance C. The frequency, f, of the oscillator circuit 770 can be expressed as follows:

$$f = \frac{1}{2}\left(\frac{1}{V_{ref}}\right)\left(\frac{I_{ch}}{C}\right)$$

As can be seen from the above equation, the trimming of the frequency of the oscillator circuit 770 can be accomplished by increasing or decreasing the amount of capacitance in the oscillator circuit. The currents $I_{ch1}$ and $I_{ch2}$ are changed by adding or removing tuning capacitors 791, 792, 793 and 794 into parallel configuration with capacitor 781 or 782. When the capacitance increases, the frequency of the oscillator circuit 770 decreases, and vice versa.

Because the oscillator circuit 770 is a symmetrical circuit, any addition or subtraction of a tuning capacitor 791 or 792 into a parallel configuration with capacitor 781 in the first half should be matched with a corresponding addition or subtraction of a tuning capacitor 793 or 794 into a parallel configuration with capacitor 782 in the second half. In one embodiment (not shown), the tuning circuit 700 includes twenty-four (24) tuning capacitors, twenty-four (24) transmission gates, and twenty-four (24) probe pads. Because of the symmetry of the tuning circuit 700, pairs of tuning capacitors, such as tuning capacitor 791 and tuning capacitor 793, can be ganged together, thereby cutting in half the number of probe pads that are needed. In another embodiment (not shown), the number of probe pads is reduced to twelve (12), with the number of tuning capacitors and transmission gates remaining at twenty-four (24) of each. In such embodiment, pairs of tuning capacitors, such as tuning capacitor 791 and tuning capacitor 793, are ganged together. Therefore, in such embodiment, the operation of each pair of test structures, such as the pair consisting of test structure 786 and test structure 788, is controlled by a single probe pad.

The method in accordance with the invention applies different adjustments (i.e., trimming) to a single packaged integrated circuit 101 using cuts and jumpers that can be both switched on and off using the probe needle 141. The method in accordance with the invention implements cuts and jumpers, each of which are activated and deactivate by the probe needle 141, without performing the FIB method, thereby reducing cost and time of evaluation.

The method in accordance with the invention allows not only trimming applications, but also evaluating derivatives of values and functions. For example, a circuit designed to source a default 10 mA current, can be evaluated for 50 mA. As another example, a pulldown resistor can be turned into a pullup resistor.

The method in accordance with the invention allows different adjustments to be applied on a same packaged integrated circuit 101 by taking advantage of the reversibility feature of the test structure 200 and 300. Applying different adjustments on a same packaged integrated circuit 101 (taking advantage of the reversibility feature of the invention) reduces the part-to-part variation of prior art methods that compare multiple integrated circuits, each integrated circuit having a different, fixed-trim configuration.

The test structure 200 and 300 and the measure structure 400 are fully compatible with standard CMOS technologies, simple implementation, low risk design approach, reduced probe area, flexibility for laboratory evaluation, and reduced cost and evaluation time.

Although the invention has been described with respect to testing and trimming of analog circuits within an integrated circuit, the invention is equally applicable to testing and trimming of digital circuits within an integrated circuit.

Although the invention has been described with respect to specific conductivity types or polarity of potentials, skilled artisans appreciated that conductivity types and polarities of potentials may be reversed.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

Although the invention is described herein with reference to specific embodiments, various modifications and changes can be made without departing from the scope of the present invention as set forth in the claims below.

What is claimed is:

1. A packaged integrated circuit, comprising:
   a circuit-supporting substrate encapsulated by packaging;
   an electronic circuit, disposed on the circuit-supporting substrate; and
   a test structure, disposed on the circuit-supporting substrate, the test structure including a probe pad and a switching circuit for connecting and disconnecting portions of the electronic circuit, wherein upon power-up the switching circuit has a natural state of one of normally-open and normally-closed, and wherein the switching circuit changes state from the natural state to a new state upon application of a momentary signal to the probe pad;
   wherein the packaging has a window through which at least the probe pad is accessible for direct contact by a probe needle.

2. The packaged integrated circuit of claim 1, wherein the switching circuit is configured to remain in the new state until power is removed from the switching circuit.

3. The packaged integrated circuit of claim 1, wherein when the switching circuit is powered by a voltage of potential $V_{DD}$ over ground potential, the switching circuit changes state from the natural state to the new state upon application of a voltage of ground potential to the probe pad.

4. The packaged integrated circuit of claim 3, wherein the switching circuit is configured to remain in the new state until application of a voltage of $V_{DD}$ potential to the probe pad.

5. The packaged integrated circuit of claim 1, wherein, upon power-up, the switching circuit has a natural state of normally-open, and wherein the switching circuit changes its state from the normally-open state to a closed state upon application of a momentary signal to the probe pad.

6. The packaged integrated circuit of claim 1, wherein, upon power-up, the switching circuit has a natural state of normally-closed, and wherein the switching circuit changes its state from a normally-closed state to an open state upon application of a momentary signal to the probe pad.

7. The packaged integrated circuit of claim 1, wherein the switching circuit includes a transmission gate, coupled between portions of the electronic circuit, for connecting and disconnecting portions of the electronic circuit.

8. The packaged integrated circuit of claim 1, wherein the electronic circuit is characterized as a bandgap voltage generator circuit.

9. The packaged integrated circuit of claim 1, wherein the electronic circuit is characterized as an oscillator circuit.

10. A packaged integrated circuit, comprising:
a circuit-supporting substrate encapsulated by packaging; and
a test structure disposed on the circuit-supporting substrate, the test structure including:
a probe pad disposed at a surface of the circuit-supporting substrate,
a transmission gate, having an input coupled to a first portion of an electronic circuit within the packaged integrated circuit, and having an output coupled to a second portion of the electronic circuit, for connecting and disconnecting portions of the electronic circuit in response to a momentary signal applied to the probe pad, when the packaged integrated circuit is powered-up,
a first inverter having an input coupled to the probe pad, and having an output coupled to a control input of the transmission gate, and
a second inverter having an input coupled to an output of the first inverter, and having an output coupled to another control input of the transmission gate, wherein the output of the second inverter is coupled to the input of the first inverter.

11. The packaged integrated circuit of claim 10, wherein, upon power-up of the test structure, the transmission gate connects the portions of the electronic circuit, and, in response to application of the momentary signal to the probe pad, the transmission gate disconnects the portions of the electronic circuit and the portions of the electronic circuit remain disconnected for as long as power is supplied to the test structure.

12. The packaged integrated circuit of claim 10, wherein, upon power-up of the test structure, the transmission gate disconnects the portions of the electronic circuit, and, in response to application of the momentary signal to the probe pad, the transmission gate connects the portions of the electronic circuit and the portions of the electronic circuit remain connected for as long as power is supplied to the test structure.

13. The packaged integrated circuit of claim 10, wherein when the test structure is powered by a voltage of potential $V_{DD}$ over ground potential, and including a first start-up capacitor having one end coupled to $V_{DD}$ and having another end coupled to the input of the first inverter, for ensuring that the output of the first inverter is at a logical "0" at power-up of the test structure.

14. The packaged integrated circuit of claim 13, wherein the first inverter comprises a NMOS transistor and a PMOS transistor, and wherein a ratio of channel width to channel length (W/L) of the NMOS transistor is larger than the W/L of the PMOS transistor, to ensure that the output of the first inverter is logical "0" at power-up of the test structure.

15. The packaged integrated circuit of claim 10, wherein when the test structure is powered by a voltage of potential $V_{DD}$ over ground potential, and including a second start-up capacitor having one end coupled to ground potential and having another end coupled to the input of the second inverter, for ensuring that the output of the second inverter is at a logical "1" at power-up of the test structure.

16. The packaged integrated circuit of claim 15, wherein the second inverter comprises a NMOS transistor and a PMOS transistor, and wherein a ratio of channel width to channel length (W/L) of the NMOS transistor is smaller than the W/L of the PMOS transistor, to ensure that the output of the second inverter is logical "1" at power-up of the test structure.

17. The packaged integrated circuit of claim 10 wherein the packaging has a window through which at least the probe pad is accessible for direct contact by a probe needle.

18. The packaged integrated circuit of claim 10, wherein the electronic circuit is characterized as a measure circuit.

19. The packaged integrated circuit of claim 10, wherein the electronic circuit is characterized as a bandgap voltage generator circuit.

20. The packaged integrated circuit of claim 10, wherein the electronic circuit is characterized as an oscillator circuit.

* * * * *